United States Patent
Li

(10) Patent No.: US 8,046,407 B2
(45) Date of Patent: Oct. 25, 2011

(54) METHOD FOR PROCESSING A CONTROL MESSAGE AND A MESSAGE PROCESSOR, A MEDIA SERVICE, A MEDIA SERVICE SYSTEM

(75) Inventor: Yi Li, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 11 days.

(21) Appl. No.: 12/622,778

(22) Filed: Nov. 20, 2009

(65) Prior Publication Data

US 2010/0070574 A1    Mar. 18, 2010

Related U.S. Application Data

(63) Continuation of application No. PCT/CN2008/071192, filed on Jun. 5, 2008.

(30) Foreign Application Priority Data

Jun. 14, 2007 (CN) .......................... 2007 1 0111193

(51) Int. Cl.
*G06F 15/16* (2006.01)
(52) U.S. Cl. ........ 709/203; 709/231; 709/224; 709/226; 709/228; 370/331; 370/332; 370/333; 370/235; 455/436; 455/437; 455/439
(58) Field of Classification Search .................. 709/231, 709/203, 228, 224, 226; 370/331–333, 235; 455/436, 437, 439
See application file for complete search history.

(56) References Cited

U.S. PATENT DOCUMENTS 6,014,706 A * 1/2000 Cannon et al. ................ 709/231
6,378,234 B1   4/2002 Luo
(Continued)

FOREIGN PATENT DOCUMENTS

CN       1647565 A       7/2005
(Continued)

OTHER PUBLICATIONS

Written Opinion of the International Searching Authority (translation) dated (mailed) Sep. 18, 2008, issued in related Application No. PCT/CN2008/071192, filed Jun. 5, 2008, Huawei Technologies Co., Ltd.

(Continued)

*Primary Examiner* — Wing Chan
*Assistant Examiner* — Hitesh Patel
(74) *Attorney, Agent, or Firm* — Finnegan, Henderson, Farabow, Garrett & Dunner LLP

(57) ABSTRACT

A method for processing a control message sent by a terminal is provided according to the present invention. The method includes determining whether or not to trigger a shortcut key analysis when the control message is sent from the terminal and accomplishing various extended control operations by a shortcut key analysis. A message processor, a media server, and a media service system are also provided. With the method of the present invention, the terminal may utilize the existing keys to send a series of control messages in accordance with a transmission sequence mechanism recognized by the server. The server may interpret the control message according to a predetermined rule and thus the purpose of extending the service control functions at the terminal side can be accomplished. Accordingly, no modification is needed to the software or hardware of the existing terminal, which bring convenience to the users.

13 Claims, 3 Drawing Sheets

U.S. PATENT DOCUMENTS

| | | | |
|---|---|---|---|
| 6,879,843 B1 | 4/2005 | Kim | |
| 2004/0266391 A1* | 12/2004 | Hafren | 455/405 |
| 2005/0176447 A1 | 8/2005 | Majewski et al. | |
| 2005/0273784 A1* | 12/2005 | Lee et al. | 718/100 |
| 2005/0283535 A1 | 12/2005 | Covell et al. | |
| 2006/0090187 A1 | 4/2006 | Chae et al. | |
| 2007/0297429 A1 | 12/2007 | Wu et al. | |
| 2008/0005348 A1* | 1/2008 | Kosiba et al. | 709/231 |

FOREIGN PATENT DOCUMENTS

| | | |
|---|---|---|
| CN | 1878175 A | 12/2006 |
| CN | 1898935 A | 1/2007 |
| CN | 1901563 A | 1/2007 |
| EP | 1670250 A2 | 6/2006 |

OTHER PUBLICATIONS

European Patent Office Communication pursuant to Article 94(3) EPC, European search opinion for Application No. 08757603.9, mailed Mar. 7, 2011, Huawei Technologies Co., LTD.

Extended European Search Report dated (mailed) May 7, 2010, issued in related Application No. 08757603.9-2413, PCT/CN2008071192, Hauwei Technologies Co., Ltd.

First Chinese Office Action dated (mailed) Oct. 23, 2009, issued in related Chinese Application No. 200710111193.8 Huawei Technologies Co., LTD.

* cited by examiner

METHOD FOR PROCESSING A CONTROL MESSAGE AND A MESSAGE PROCESSOR, A MEDIA SERVICE, A MEDIA SERVICE SYSTEM

CROSS-REFERENCE TO RELATED APPLICATIONS

This application is a continuation of International Application No. PCT/CN2008/071192, filed on Jun. 5, 2008, which claims the benefit of Chinese Application No. 200710111193.8, filed on Jun. 14, 2007, both of which are hereby incorporated by reference in their entireties.

FIELD OF DISCLOSURE

The present invention relates to communication field, and more specifically, to a method and apparatuses for processing a control message and a system thereof.

BACKGROUND

With the improvement of wireless network infrastructure, mobile application services based on various wireless network schemas develop rapidly. Generally, a mobile station may conduct a simple control over an application service process on a network server by sending a control message.

Usually, there is an one-to-one correspondence between the content of a control message sent by the mobile station and a key on the mobile station (of course, a key can be shared in a case where the contents of the control messages appear in turn, for instance, the play key and the pause key for controlling the media can be shared. When this key is pressed consecutively, the key alternately sends a control message with different content). Therefore, due to the limitation of the size of the generic mobile station, there are not sufficient keys for service control, limiting thereby the service control functions provided by the mobile station to the user.

For instance, in terms of a mobile streaming media service which provides a mobile multimedia broadcast service to the user, since a user terminal is typically provided with four navigation keys only, the user may use those four keys to realize a basic control over the streaming media including forward, backward, pause/play, stop. Assume the mobile streaming media service adopts a Real-time Streaming Protocol (RTSP). An example of a forward operation during playing is described below, which illustrates a process of a terminal providing a service control function to the user.

1. A streaming media service utilizes an RTSP protocol to play a streaming media to a terminal.

2. When playing up to the tenth second, the user presses the forward key. The terminal sends a PLAY message in the RTSP protocol to the streaming media server and inserts, in a RANGE field of the PLAY message, information of a time point where the user wants to skip to. Usually, the intended time point is determined by adding a fixed value set internally by the terminal (assume 15 sec) to the current time ($10^{th}$ sec), which is 25 sec for the value of RANGE in the PLAY message transmitted by the terminal. This indicates that the terminal wants the streaming media server to start playing program at the $25^{th}$ second.

3. After the streaming media server receives the control message PLAY, the server analyzes parameters of the message and returns a success message to the terminal, indicating that the server accepts this command and broadcasts the program starting from the $25^{th}$ second.

At the user end, it appears that the user presses a forward key at the $10^{th}$ second and the user is then presented with the content starting from the $25^{th}$ second. The user considers that the forwarding function is accomplished.

The backward operation is similar to the above mentioned forward operation, except that the value of RANGE in the PLAY message transmitted from the terminal is obtained by subtracting an internal fixed value from the current time.

Generally, the default values for forward and backward are set by the terminal software and they can not be modified through an interface. Therefore, the user can only forward or backward the streaming media program with a fixed time interval when pressing the forward or backward key of the navigation keys. When the program is long, for instance, 10 minutes, and if the user needs to move forward to a specified time, e.g., the $6^{th}$ minute, based on the above assumption the user may probably need to press the forward key for 24 times to achieve the effect, which is inconvenient for the user.

In practice, the RTSP protocol also provides richer control functions such as "double rate forward" and "double rate backward". That is, a dedicated SCALE field can be employed in the PLAY message to carry a parameter indicating the scale of the play speed, e.g., 2, 0.1, −4 may indicate 2× forward rate, 0.1× forward rate, 4× backward rate, etc. However, considering the mechanism of implementation of the existing control function, in order to provide these extended functions, the terminal needs to be provided with additional dedicated keys for the operation of the corresponding n× forward rate and n× backward rate. Accordingly, major modifications to the existing key arrangement and control software of the terminal, etc., are required, which is not conducive to the promotion and application of the services.

SUMMARY

A method and apparatuses for processing a control message and a system thereof are provided according to embodiments of the present invention. By processing the control message sent from the terminal, the functions of the terminal can be extended without modifications to the software or hardware of the terminal.

A method for processing a control message sent by a terminal may include:
  receiving a control message from the terminal;
  determining to trigger a shortcut key analysis based on a currently received control message;
  performing the shortcut key analysis on two or more received control messages;
  obtaining a corresponding operation command according to a result of the shortcut key analysis; and
  performing a corresponding control operation according to the operation command.

A message processor may include:
  a message receiver, configured to receive a control message from a terminal;
  a message analyzer, configured to determine to trigger a shortcut key analysis based on a currently received control message and perform the shortcut key analysis on two or more most recently received control messages;
  a key service analyzer, configured to obtain a corresponding operation command according to a result of the shortcut key analysis.

A media server may include:
  a message processor, configured to receive a control message from a terminal, determine to trigger a shortcut key analysis based on a currently received control message, perform the shortcut key analysis on two or more most recently received control messages, and obtain a corresponding operation command based on a result of the shortcut key analysis;

at least one broadcast service unit, wherein each broadcast service unit executes a control operation corresponding to an operation command obtained from the message processor.

A media service system may include:

a media server, configured to receive a control message from a terminal, determine to trigger a shortcut key analysis based on a currently received control message, perform the shortcut key analysis on two or more most recently received control messages, send shortcut key information obtained after the analysis and receive a returned operation command.

a key analyzing server, configured to receive the shortcut key information from the media server, search for an operation command associated with the shortcut key information and send the operation command to the media server.

Embodiments of the present invention adopt a method of determining whether the control message sent from the terminal triggers a shortcut key analysis and obtaining various extended control operations through the shortcut key analysis. The terminal may send a sequence of control messages with the existing keys in accordance with the transmission sequence mechanism recognized by the server. The server may interpret the control message according to a predetermined rule and thus the purpose of extending the service control functions at the terminal side can be accomplished. With the above method, the existing terminal does not need to modify the software or hardware, which brings convenience to the user.

DETAILED DESCRIPTION

A method for processing a control message sent from a terminal is provided according to one embodiment of the present invention. The method includes determining whether to trigger a shortcut key analysis when the control message is sent from the terminal and accomplishing various extended control operations by a shortcut key analysis. A message processor, a media server, and a media service system are also provided according to embodiments of the present invention. Various embodiments are detailed below.

First Embodiment

Figure 1:
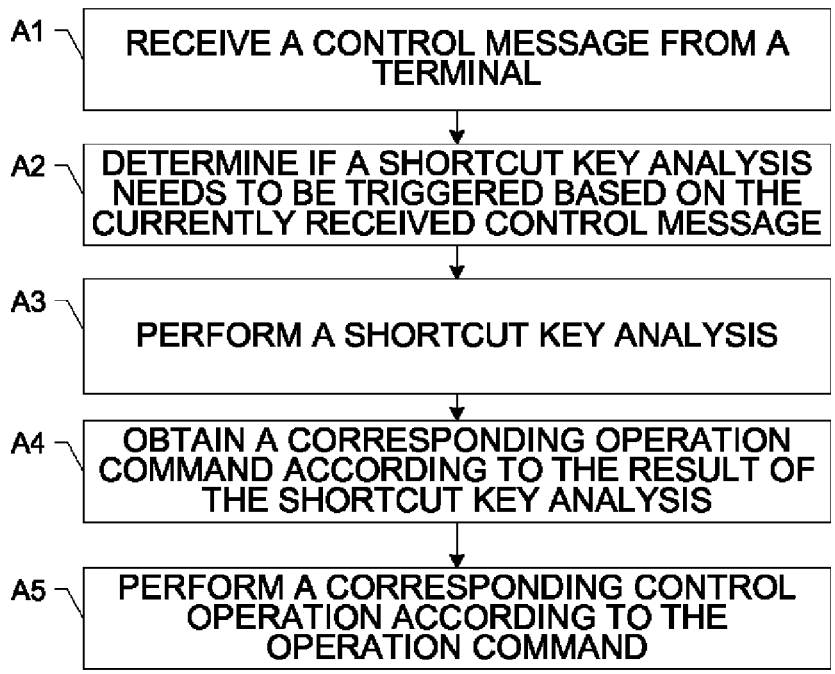
FIG. 1 is a flowchart of a method for processing a control message sent from a terminal according to a first embodiment of the present invention.

A method for processing a control message sent from a terminal. As illustrated in FIG. 1, the method includes the following:

A1: receiving a control message from a terminal.

The received control message corresponds to key(s) on the terminal. For instance, a conventional terminal may send a control message when a user is pressing a forward or backward key.

A2: determining if a shortcut key analysis needs to be triggered based on the currently received control message.

After receiving the control message from the terminal, a server needs to determine whether or not to trigger a shortcut key analysis. If the condition for a trigger operation is not satisfied, the procedure of processing the control message may follow an existing procedure, which is not the topic of the present embodiment. The determination on whether or not to perform a trigger operation may follow a predetermined trigger rule. Since the control message is sent in accordance with a conventional method, the trigger rule may be independent of the content of the control message. Considering a usage habit of the user, the trigger rule may be designed according to two schemas below.

I. Sequence Control

An impossible or rare sequence of the control messages under a normal condition is utilized as a trigger rule. At the user side, it corresponds to a specific key-pressing sequence. The server may perform a determination operation by memorizing the sequence of the received control messages. When a certain received control message renders the sequence of the already received control messages to match the trigger rule for the shortcut key analysis, the server determines that the shortcut key analysis needs to be triggered.

II. Time Control

The time interval between the reception time for the currently received control message and the reception time for the latest received control message is utilized as a trigger rule. At the user side, it corresponds to a series of keys pressed consecutively within a predetermined interval (keys pressed consecutively may be the same or may be different, which depends on the specific rule). When the time interval between a received control message and a previously received control message is less than the predetermined value, the server determines that the shortcut key analysis needs to be triggered.

Specifically, the above time-control-based trigger rule may be triggered by employing a time-recording approach or a timer approach.

1) Time-recording Approach

A reception time for each control message is recorded. The time interval between the reception time for the currently received control message and the reception time for the latest received control message is calculated. If the time interval is less than a predetermined value, it is determined that a shortcut key analysis needs to be triggered.

2) Timer Manner Approach

After each control message is received, a first timer is enabled. If the first timer does not expire when a current control message is received, it is determined that a shortcut key analysis needs to be triggered.

Of course, sequence control and time control may also be employed in combination. For instance, a specific sequence of control messages received within a predetermined time interval can be utilized as a trigger rule. The specific rule depends on actual situations, which shall not be construed as a limitation to the present invention.

In addition, it should be noted that the determination on whether or not to perform the trigger operation in step A2 may be performed right after a control message is received or may be performed after a time period, which means that a delay operation is provided before step A2.

After each control message is received, a second timer is enabled. The determination on whether the currently received control message triggers the shortcut key analysis may not be performed until the second timer expires.

The function of the delay operation is illustrated by way of example. Assume a control message sequence is a1, a2, a3, the time interval between each of them qualifies the trigger rule when the time control method is adopted. If no delay is provided, a2, a3 may trigger the server to perform twice shortcut key analyses. If the delay is provided (assume delay time equals the predetermined value provided in the time control method), the server may trigger the shortcut key analysis only when a3 is received, thus simplifying the processing procedure for the server. If the control message is received within the delay time and the control message has not been checked for whether or not to trigger the shortcut key analysis, the control message can be processed in a conventional method, or can be dismissed. The control message is not processed separately.

A3: Performing a shortcut key analysis on the two or more most recently received control messages.

After the shortcut key analysis is triggered, the server may perform an analysis process in accordance with a predetermined rule. According to user habits, usually, the analysis object is two or more most recently received control messages. The result of the analysis may be embodied in the corresponding shortcut key information. Since the analysis rule is related to the resulting function, the analysis rule is typically associated with the content of the control message triggering the shortcut key analysis.

In addition, the analysis rule may include entire or partial contents of the trigger rule. Take the trigger rule for the sequence control as an example, assume that the control message sequence a1, a2, a3 and a4, a5, a6 are trigger rule for the sequence control, the associated analysis rule can be provisioned as: The control message sequence a1, a2, a3 corresponds to a first shortcut key. The control message sequence a4, a5, a6 corresponds to a second shortcut key.

A4: Obtaining a corresponding operation command according to the result of the shortcut key analysis.

An association can be pre-established between the result of the shortcut key analysis and the operation command. The association can be stored in the form of texts, tables, data files, etc. When the result of the shortcut key analysis is identified with concrete shortcut key information, the operation command associated with the shortcut key information can be obtained by searching.

A5: Performing a corresponding control operation according to the operation command.

In this regard, the control operation performed by the server is the extended operation for the terminal which sends conventional control messages, because the terminal does not have such dedicated key for such function. The effect of the operation performed is similar to that of the operation performed in the case where the server analyses the dedicated control information sent from a terminal having a dedicated key.

The above embodiment adopts a method of determining whether the control message sent from the terminal triggers a shortcut key analysis and obtaining various extended control operations through the shortcut key analysis. The terminal may send a sequence of control messages with the existing keys in accordance with the transmission sequence mechanism recognized by the server. The server may interpret the control message according to a predetermined rule and thus the purpose of extending the service control function at the terminal side can be accomplished. With the above method, the existing terminal does not need to modify the software or hardware, which brings convenience to the user.

By way of example, a scenario where the first embodiment is applied to a play control for a streaming media service is described below.

Second Embodiment

Figure 2:
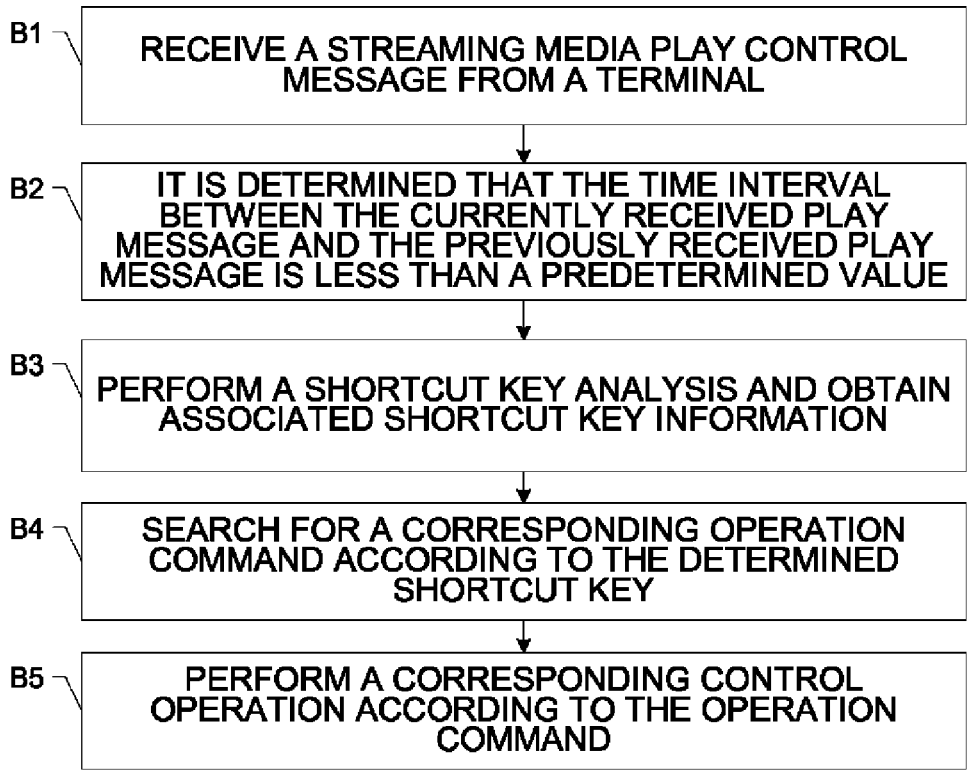
FIG. 2 is a flowchart of a method for processing a control message sent from a terminal according to a second embodiment of the present invention.

A method for processing a control message sent from a terminal. The control message sent by the terminal in this embodiment is a streaming media play control message. The processing procedure at the server side is illustrated in FIG. 2. The procedure includes the following steps.

B1: Receiving a streaming media play control message PLAY from a terminal.

The terminal in this embodiment is a conventional terminal. The PLAY message carries a field RANGE, indicating a play time point.

B2: With a time control method, it is determined that the currently received control message triggers a shortcut key analysis. That is, it is determined that the time interval between the currently received PLAY message and the previously received PLAY message is less than a predetermined value.

Specifically, a reception time (Tlp) of the most recently received PLAY message from the user is recorded. The current reception time (Tcp) is recorded when receiving a new PLAY message.

If $Tcp-Tlp \leqq N$ (N is a predetermined time period), it is determined to trigger a shortcut key analysis.

B3: Shortcut key analysis is performed and associated shortcut key information is obtained.

The present embodiment takes the parameters carried in the control message as the analysis rule. Assume that the RANGE in the current PLAY message represents a time Tcr, and the current play time of the media is Tdr, the shortcut key analysis rule is given below.

If $Tcr \geqq Tdr$, i.e., the user presses a forward key, then the corresponding shortcut key is determined as Key a.

If $Tcr \leqq Tdr$, i.e., the user presses a backward key, then the corresponding shortcut key is determined as Key b.

Of course, in addition to the parameters carried in the control message, the analysis rule may further include other contents, such as the number of control messages received recently within a predetermined time period (the control message can be the same, or different), or the number of the control messages received consecutively recently where the intervals between the reception times of these messages are less than a predetermined value. More shortcut keys are available by providing more detailed analysis rule such that richer terminal control functions can be extended.

B4: Searching for an operation command associated with the determined shortcut key.

In this embodiment, two shortcut keys Key a and Key b are provided. Therefore, two corresponding extended operation commands can be configured.

For instance, Key a may correspond to "2× forward rate" and Key b may correspond to "4× backward rate". The association can be stored in a text format (assume that the file name is avsync.3gp.keymap).

Key a=Fast+2
Key b=Fast−4

In another example, Key a may correspond to "Jump to next two programs in the play list", while Key b may correspond to "Jump to the previous program in the play list". Accordingly, the avsync.3gp.keymap is described as:

Key a=JumpToNext+2
Key b=JumpToNext−1

After the server determines a shortcut key, the server parses the avsync.3gp.keymap file and the corresponding operation commands can be found.

Of course, the association between the shortcut key and the operation command may be stored in other format, such as XML.

```
<Keyf>Fast
    <Param>2</Param>
</Keyf>
```

Similarly, the shortcut key may correspond to various extended service functions, including but not limited to double rate forward, double rate backward, jumping to a specific program in the play list, jumping to a specified streaming media service, etc.

B5: Performing a corresponding control operation according to the operation command.

This step may refer to step A5 in the first embodiment.

The present embodiment allows a conventional terminal simply having forward, backward keys to be able to realize the extended streaming media control functions such as double rate forward, double rate backward, program switching.

To facilitate the understanding of the above embodiment, two application scenarios based on RTSP protocol according to the second embodiment are described below.

I. Implementation of a Double Rate Forward Function in a Conventional Cell Phone Assume that trigger rule for the shortcut key analysis is N=2 second; analysis rule is Tcr≧Tdr: Key a, Tcr≦Tdr: Key b; the association between the shortcut key and the operation command is described in avsync.3gp.keymap:

Key a=Fast+2
Key b=Fast−4

Figure 3:
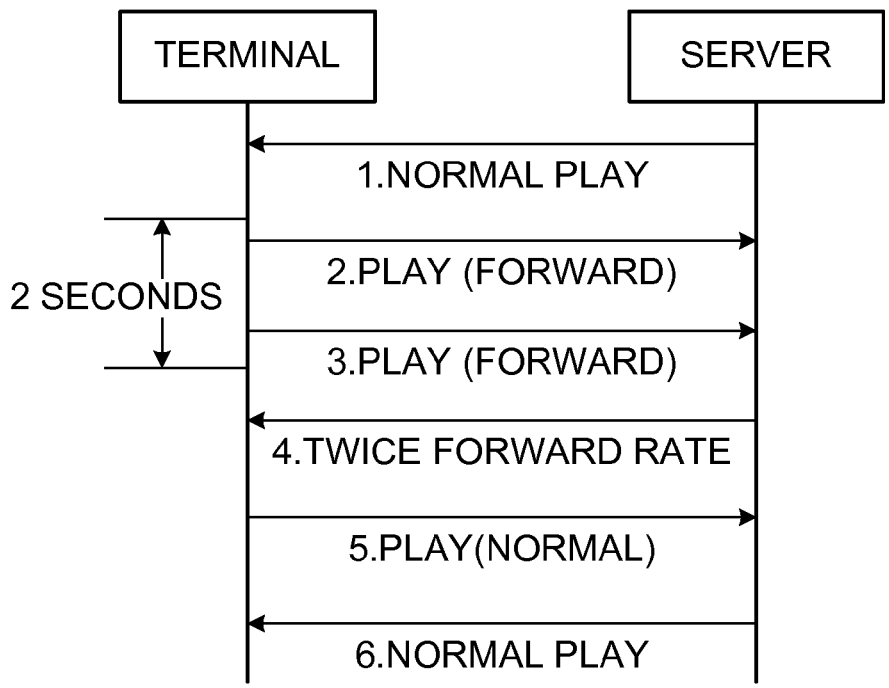
FIG. 3 is a schematic of a first application scenario for the second embodiment of the present invention.

The procedure is illustrated in FIG. 3, which includes:

1. The server starts to broadcast a streaming media file avsync.3gp to the terminal.

2. The user presses a forward key of the navigation keys at the $10^{th}$ second (assume a default value for the forward step is 15 second) and sends a PLAY message where the RANGE time is 25 to the server. The server records the time of receiving the PLAY message as Tlp and starts to broadcast the streaming media to the terminal from the $25^{th}$ second.

3. In 2 seconds, the user again presses the forward key of navigation keys and sends a PLAY message where RANGE time is about 40 to the server. The server records the time of receiving the PLAY message as Tcp. Apparently, the Tcp−Tlp≦2. Shortcut key analysis is triggered. The server updates Tlp with Tcp. In the meantime, the current playing time of the media is around 25 second. Apparently, Tcr≧Tdr. Therefore, the server determines that the shortcut key is Key a.

4. The server analyses avsync.3gp.keymap, and obtains an operation command "double rate forward", i.e., initiates a broadcast service unit for backward/forward service to perform a double rate forward operation.

5. Assume that the media is moved forward to about $6^{th}$ minute with twice the speed (consume 3 minutes actually). The user presses the play key in the navigation keys and sends a PLAY message where the RANGE time is the current play time to the server. The server records the time of receiving the PLAY message as Tcp. Apparently, Tcp−Tlp>2, and shortcut key analysis is not triggered. The server updates Tlp with Tcp.

Then, the server processes the PLAY message in accordance with a conventional procedure and determines that it is a normal play.

6. The server starts a normal play procedure and the streaming media is played normally.

II. Implementation of the Program Switching in a Conventional Cell Phone

Assume that the program sequence in the current play list aysync.smil is as follows: the first program is avsync1.3gp, the second program is avsync2.3gp. The trigger rule for shortcut key analysis N=2 second. The analysis rule is Tcr≧Tdr: Key a, Tcr≦Tdr: Key b; the association between the shortcut key and the operation command is described in aysync.smil.map:

Key a=JumpToNext+1
Key b=JumpToNext−1

Figure 4:
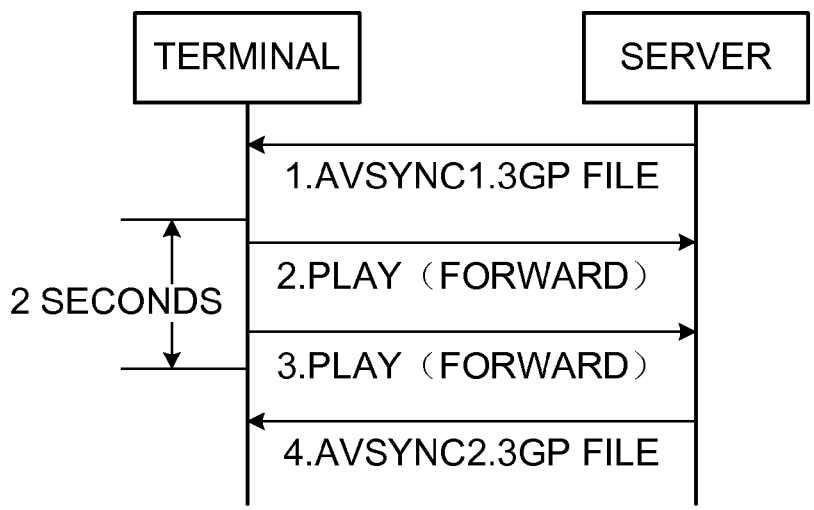
FIG. 4 is a schematic of a second application scenario for the second embodiment of the present invention.

The procedure is illustrated in FIG. 4, which includes:

1. The server starts to broadcast the first program avsync1.3gp in the current play list aysync.smil to the terminal.

2. The user presses a forward key in the navigation keys at $10^{th}$ second (assume a default value for the forward step is 15 second) and sends a PLAY message where the RANGE time is 25 to the server. The server records the time of receiving the PLAY message as Tlp and starts to broadcast the streaming media to the terminal from the $25^{th}$ second.

3. In 2 seconds, the user again presses the forward key in the navigation keys and sends a PLAY message where RANGE time is about 40 to the server. The server records the time of receiving the PLAY message as Tcp. Apparently, the Tcp−Tlp≦2. Shortcut key analysis is triggered. The server updates Tlp with Tcp. In the meantime, the current play time of the media is around 25 second. Apparently, Tcr≧Tdr. Therefore, the server determines that the shortcut key is Key a.

4. The server parses avsync.smil.map and obtains an operation command of "Jump to a next program in the play list". A broadcast service unit for program switching is enabled to broadcast avsync2.3gp file. Consequently, the program switching function is achieved.

It should be understood that the software for processing the control message sent from the terminal may be stored in a computer readable media. When the software is executing at the server side, the procedure includes receiving a control message from the terminal; determining based on the currently received control message that a shortcut key analysis needs to be triggered; performing a shortcut key analysis on the two or more most recently received control messages; obtaining corresponding operation commands based on the result of the shortcut key analysis; executing corresponding control operations according to the operation commands. The readable media includes a ROM/RAM, a magnetic disc, an optical disc, etc.

Apparatuses and devices according to the embodiments of the present invention are illustrated below.

Third Embodiment

A Message Processor 10

Figure 5:
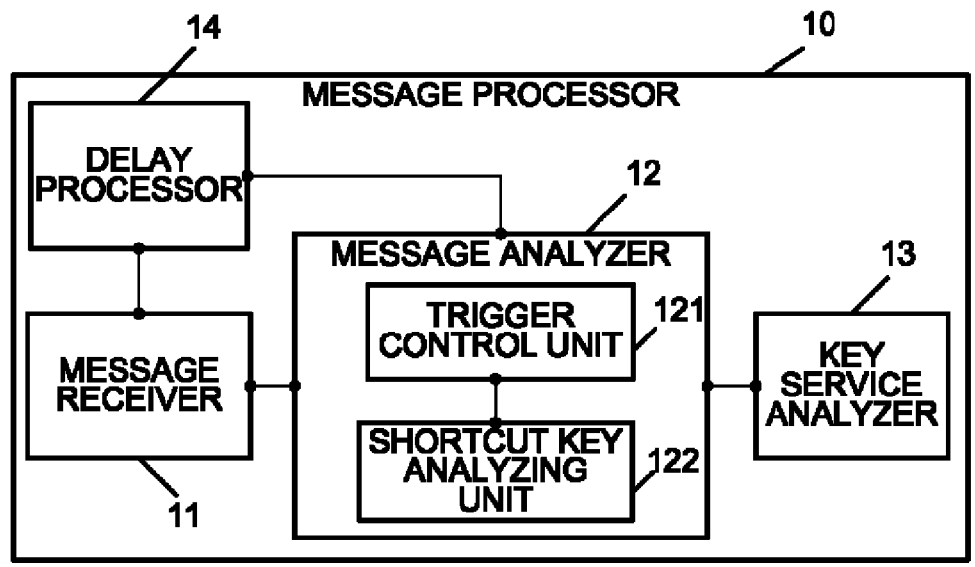
FIG. 5 is a logic schematic of a message processor according to a third embodiment of the present invention.

As illustrated in FIG. 5, the message processor 10 includes:
a message receiver 11, configured to receive a control message from a terminal;
a message analyzer 12, configured to determine to trigger a shortcut key analysis based on the control messages currently received by the message receiver 11 and perform the shortcut key analysis on two or more most recently received control messages;

a key service analyzer 13, configured to obtain corresponding operation commands according to the result of the shortcut key analysis performed by the message analyzer 12.

If time control method is adopted, the message analyzer 12 may include:

a trigger control unit 121, configured to determine whether or not to trigger a shortcut key analysis according to the time interval between the reception time for the currently control message received by the message receiver 11 and the reception time for the latest received control message, where, based on different trigger manner, the trigger control unit 121 may adopt a timer to control the time or adopt a time recording unit to control the time;

a shortcut key analyzing unit 122, configured to analyze the most recently received two or more control messages so as to obtain associated shortcut key information when the trigger control unit 121 determines to trigger the shortcut key analysis, wherein the key service analyzer 13 obtains corresponding operation commands according to the shortcut key information obtained by the shortcut key analysis unit 122.

In order to delay the determination on whether or not to perform a trigger operation, the message processor of the present embodiment may further include a delay processor 14 configured to enable a timer after the message receiver 11 receives each control message. The message analyzer 12 is not asked to determine whether the currently received control message triggers a shortcut key analysis until the timer expires.

The operation of the message processor according to the present invention may refer to the method of processing control messages sent from the corresponding terminal according to the first embodiment.

Fourth Embodiment

A Media Server 20

Figure 6:
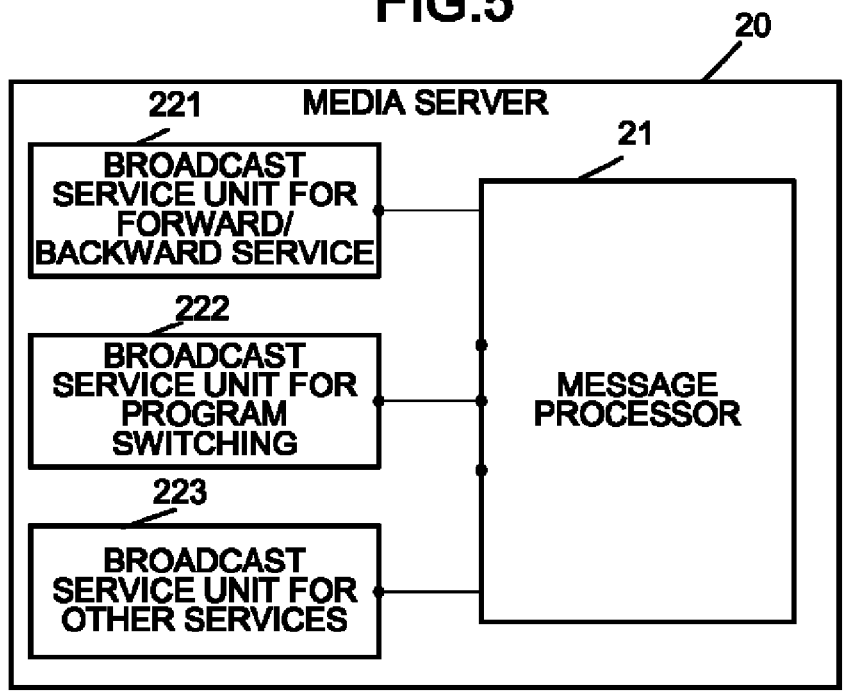
FIG. 6 is a logic schematic of a media server according to a fourth embodiment of the present invention.
Figure 7:
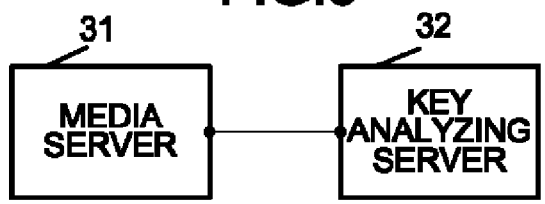
FIG. 7 is a logic schematic of a media service system according to a fifth embodiment of the present invention.

As illustrated in FIG. 6, the media server 20 includes:

a message processor 21, configured to receive a control message from the terminal, determine based on the currently received control message that a shortcut key analysis needs to be triggered, perform a shortcut key analysis on the two or more most recently received control messages, and obtain a corresponding operation command based on the result of the shortcut key analysis; and a plurality of broadcast service units.

For simplicity, FIG. 6 illustrates, for example, a broadcast service unit for forward/backward service 221, a broadcast service unit for program switching 222, a broadcast service unit for other services 223. In practice, the message processor may include one or more of the foregoing units. Of course, the message processor may further include other types of broadcast service units. Each broadcast service unit is configured to execute a control operation corresponding to an operation command obtained from the message processor 21.

The structure of the message processor according to the present embodiment may be consistent with the structure mentioned in the third embodiment, which may refer to the method of processing control messages sent from the corresponding terminal according to the second embodiment.

Fifth Embodiment

A Media Service System

The difference between the present embodiment and the fourth embodiment is that, according to the fourth embodiment, the function of obtaining the operation command according to the result of shortcut key analysis is executed by the message analyzer in the media server. In this embodiment, this function is executed by an independent key analyzing server. The key analyzing server and the media server in communication with the key analyzing server can be integrated into a media service system for processing the control messages. As illustrated in FIG. 6, the architecture of the media service system includes:

a media server 31, configured to receive a control message from the terminal; determining based on the currently received control message that a shortcut key analysis needs to be triggered; performing a shortcut key analysis on the two or more most recently received control messages; sending the obtained shortcut key information and receiving a returned operation command; and a key analyzing server 32, configured to receive the shortcut key information from the media server 31 and search for the operation commands associated with the shortcut key information and send the operation commands to the media server 31.

The operation of the media service system according to the present invention may refer to the method of handling control messages sent from the corresponding terminal according to the first embodiment.

As can be seen from the foregoing embodiment, embodiments of the present invention adopt a method of determining whether the control message sent from the terminal triggers a shortcut key analysis and obtaining various extended control operations through the shortcut key analysis. The terminal may send a sequence of control messages with the existing keys in accordance with the combined transmission mechanism recognized by the server. The server may interpret the control message according to a predetermined rule and thus the purpose of extending the service control function at the terminal side can be accomplished. With the above method, the existing terminal does not require a modification to the software or hardware, which brings convenience to the user. In addition, in case of streaming media broadcast control, method embodiments of the present invention allow a conventional terminal simply having forward, backward keys to be able to realize the extended streaming media control functions such as double rate forward, double rate backward, program switching.

The method for processing a control message sent from a terminal according to embodiments of the present invention is disclosed in detail and a message processor, a media server, a media service system thereof are also disclosed in detail. Several examples are provided for explanation of the principle and implementation of the present invention. The detailed description of the embodiments is merely to facilitate the understanding of the concept of the present invention. In addition, it is appreciated by those skilled in the art that any modification without departing from the spirit of the present invention shall not be construed as limitation to the present invention.

What is claimed is:

1. A method for processing a control message sent by a terminal, comprising:

receiving, by a server a first control message sent by the terminal;

enabling, by a server a first timer upon receiving the first control message;
receiving, by a server a second control message sent by the terminal;
if the first timer does not expire at the time of receiving the second control message, determining, by a server to trigger a shortcut key analysis according to a time interval
between a reception time of the first control message and a reception time of the second control message, wherein the determining to trigger the shortcut key analysis comprises:
recording the reception time of the first control message and the reception time of the second control message;
calculating the time interval between the reception time of the first control message and the reception time of the second control message; and
determining to trigger the shortcut key analysis if the time interval is less than a predetermined value;
performing, by a server the shortcut key analysis on two or more received control messages;
obtaining, by a server a corresponding operation command according to a result of the shortcut key analysis; and
performing, by a server a corresponding control operation according to the operation command.

2. The method of claim 1, wherein the determining to trigger a shortcut key analysis further comprises:
determining, based on a sequence of received control messages, to trigger the shortcut key analysis.

3. The method of claim 1, further comprising:
enabling a second timer after receiving the first control message; and
determining, according to the second control message, to trigger the shortcut key analysis after the second timer expires.

4. The method of claim 1, wherein,
the performing of the shortcut key analysis comprises:
analyzing two or more most recently received control messages; and
obtaining corresponding shortcut key information;
the obtaining of an operation command comprises:
searching for the operation command associated with the shortcut key information.

5. The method of claim 4, wherein:
the receiving of a control message sent by the terminal comprises:
receiving a streaming media play control message from the terminal;
the performing of the shortcut key analysis comprises at least one of:
determining corresponding shortcut key information based on the second control message;
determining the corresponding shortcut key information based on parameters carried in the second control message and the number of control messages received within a most recently defined time period; and
determining the corresponding shortcut key information based on the parameters carried in the second control message and the number of control messages received consecutively recently, where a time interval between reception times of consecutive control messages is less than a predetermined value.

6. The method of claim 4, wherein the operation command associated with the shortcut key information comprises at least one of:
double rate forward, double rate backward, jumping to a specific program in a play list, and jumping to a specific streaming media service.

7. A message processor, comprising:
a processor;
a non-transitory computer-readable medium comprising:
instructions, when executed by the processor, causing a message receiver to receive a first control message and a second control message sent by a terminal;
instructions, when executed by the processor, causing a trigger control unit to: enable a first timer upon receiving the first control message if the first timer does not expire at a time of receiving the second control message, determine to trigger a shortcut key analysis according to a time interval between a reception time of the first control message and a reception time of the second control message, wherein the trigger control unit is further configured to:
record the reception time of the first control message and the reception time of the second control message;
calculate the time interval between the reception time of the first control message and the reception time of the second control message; and
determine to trigger the shortcut key analysis if the time interval is less than a predetermined value;
instructions, when executed by the processor, causing a message analyzer to perform the shortcut key analysis on two or more most recently received control messages; and
instructions, when executed by the processor, causing a key service analyzer to obtain a corresponding operation command according to a result of the shortcut key analysis.

8. The message processor of claim 7, wherein the non-transitory computer-readable medium further comprises:
instructions, when executed by the processor, causing the trigger control unit to determine to trigger the shortcut key analysis based on a sequence of received control messages; and
instructions, when executed by the processor, causing a shortcut key analyzing unit of the message analyzer to obtain shortcut key information corresponding to the result of the shortcut key analysis and obtain the corresponding operation command according to the shortcut key information.

9. The message processor of claim 8, the non-transitory computer-readable medium further comprising:
instructions, when executed by the processor, causing a delay processor to enable the first timer when the first control message is received, and inform, when the first timer expires, the message analyzer to determine whether the second control message triggers the shortcut key analysis.

10. A media server, comprising:
a message processor, configured to:
receive a first control message and a second control message from a terminal,
enable a timer upon receiving the first control message,
if the first timer does not expire at the time of receiving the second control message, determine to trigger a shortcut key analysis according to a time interval between a reception time of the first control message and a reception time of the second control message,
perform the shortcut key analysis on two or more most recently received control messages, and
obtain a corresponding operation command based on a result of the shortcut key analysis,
wherein the message processor is further configured to:
record the reception time of the first control message and the reception time of the second control message;

calculate the time interval between the reception time of the first control message and the reception time of the second control message; and determine to trigger the shortcut key analysis if the time interval is less than a predetermined value; and at least one broadcast service unit, configured to execute a control operation corresponding to the operation command obtained from the message processor.

11. A media service system, comprising:

a media server, configured to:

receive a first control message and a second control message from a terminal, enable a timer upon receiving the first control message, if the timer does not expire at the time of receiving the second control message, determine to trigger a shortcut key analysis according to a time interval between a reception time of the first control message and a reception time of the second control message, wherein the media server is further configured to:

record the reception time of the first control message and the reception time of the second control message, calculate the time interval between the reception time of the first control message and the reception time of the second control message, and determine to trigger the shortcut key analysis if the time interval is less than a predetermined value; and perform the shortcut key analysis on two or more most recently received control messages, send shortcut key information obtained from the shortcut key analysis, and receive a returned operation command; and a key analyzing server, configured to receive the shortcut key information from the media server, search for an operation command associated with the shortcut key information, and send the operation command to the media server.

12. The media service system of claim 11, wherein the media server is configured to determine to trigger the shortcut key analysis based on a sequence of received control messages.

13. The media server of claim 10, wherein the message processor is further configured to determine to trigger the shortcut key analysis based on a sequence of received control messages.

* * * * *